(12) United States Patent
Berke

(10) Patent No.: US 9,720,825 B2
(45) Date of Patent: Aug. 1, 2017

(54) SYSTEM AND METHOD FOR PERFORMANCE OPTIMAL PARTIAL RANK/BANK INTERLEAVING FOR NON-SYMMETRICALLY POPULATED DIMMS ACROSS DDR CHANNELS

(71) Applicant: Dell Products, LP, Round Rock, TX (US)

(72) Inventor: Stuart Allen Berke, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 181 days.

(21) Appl. No.: 14/577,416

(22) Filed: Dec. 19, 2014

(65) Prior Publication Data

US 2016/0179374 A1  Jun. 23, 2016

(51) Int. Cl.
*G06F 12/00* (2006.01)
*G06F 12/06* (2006.01)
*G06F 12/02* (2006.01)
*G11C 5/04* (2006.01)

(52) U.S. Cl.
CPC ......... *G06F 12/0607* (2013.01); *G06F 12/02* (2013.01); *G11C 5/04* (2013.01)

(58) Field of Classification Search
None
See application file for complete search history.

(56) References Cited

U.S. PATENT DOCUMENTS

| | | | |
|---|---|---|---|
| 6,233,662 B1 * | 5/2001 | Prince, Jr. ........... | G06F 12/0607 711/157 |
| 7,694,125 B2 | 4/2010 | Nijhawan et al. | |
| 2015/0100746 A1 * | 4/2015 | Rychlik ............. | G06F 12/0607 711/157 |

OTHER PUBLICATIONS

U.S. Appl. No. 14/230,911, filed Mar. 30, 2014.

* cited by examiner

*Primary Examiner* — Daniel Tsui
(74) *Attorney, Agent, or Firm* — Larson Newman, LLP

(57) ABSTRACT

An information handling system includes a processor having a plurality of memory channels. The information handling system also includes a plurality of dual inline memory modules non-symmetrically populated on the memory channels. The dual inline memory modules are divided by bank to create a plurality of interleave groups, and each of the interleave groups spans across all of the memory channels of the processor.

17 Claims, 9 Drawing Sheets

SYSTEM AND METHOD FOR PERFORMANCE OPTIMAL PARTIAL RANK/BANK INTERLEAVING FOR NON-SYMMETRICALLY POPULATED DIMMS ACROSS DDR CHANNELS

FIELD OF THE DISCLOSURE

The present disclosure generally relates to optimizing interleaving for non-symmetrically populated DIMMs across DDR channels.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

An information handling system can include a central processing unit (CPU) with multiple dual data rate (DDR) channels that can each have multiple dual inline memory modules (DIMMs). The CPU or memory controller can support memory interleaving across the DIMMs on the DDR channels. For example, consecutive cache line block accesses can be scattered across the populated DDR channels and across the DIMMs on the channels and the ranks and banks within a DIMM.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
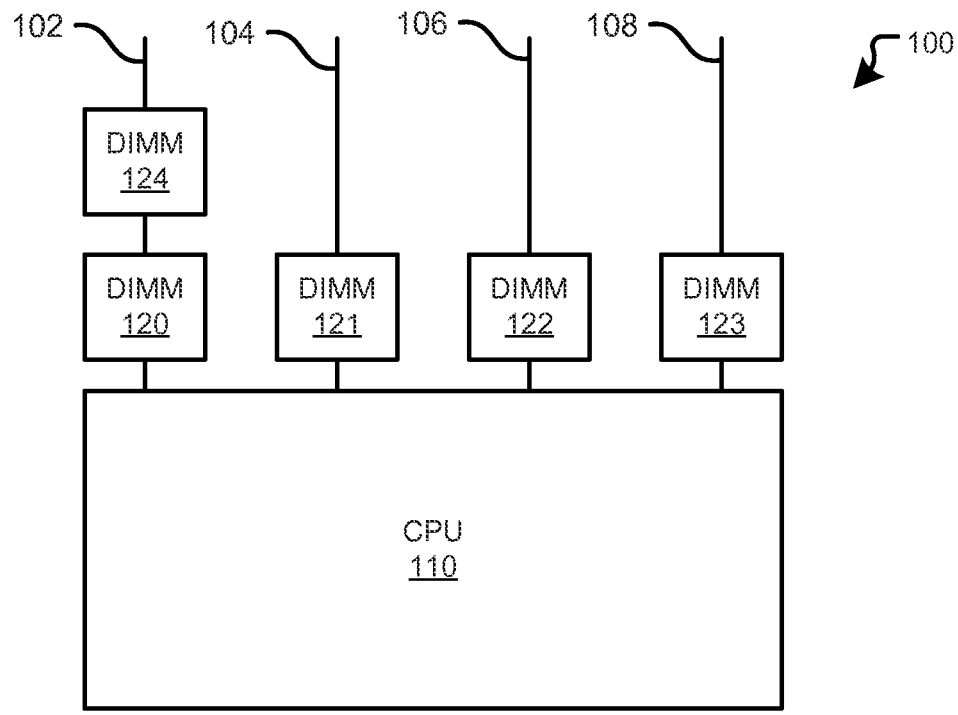
FIGS. 1-7 are block diagrams of different embodiment of an information handling system including a processor with four memory channels and multiple dual inline memory module (DIMM) slots according to an embodiment of the present disclosure.

FIG. 1 shows an information handling system 100. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

The information handling system 100 includes four double date rate (DDR) channels 102, 104, 106, and 108, and with multiple DDR slots per each channel. In different embodiments, the information handling system 100 may include a combination of standard volatile dynamic random access memory (DRAM)-based dual inline memory modules (DIMMs) and non-volatile memory (NVM)-based DIMMs, although it is also possible that a combination of volatile static SRAM DIMMs and NVM DIMMs may also be employed.

In an embodiment, the DIMM types, such as DRAM DIMMs and NVM DIMMs, may be segregated by DDR channel. For example, DDR channel 102 may be populated with DRAM DIMMs, and DDR channel 104 may be populated with NVM DIMMs. In an embodiment, the DIMM types may also be mixed on the same DDR channel. For example, DDR channels 106 and 108 may be populated with both DRAM DIMMs and NVM DIMMs. When NVM DIMMs and DRAM DIMMs are mixed on the DDR channels, the system host memory controller, such as an integrated memory controller or a non-integrated memory controller, may be programmed to configure different interleaving groups.

To statistically optimize performance, memory controllers provide interleaving schemes to ensure that consecutive memory accesses are distributed across the available memory resources. Within an interleave group, consecutive cache line accesses are scattered via a pre-defined algorithm among the available memory channels, and populated DIMMs to provide statistical low latency and high bandwidth for memory reads and writes. Many common interleave schemes use low order or high order physical address bits to determine where the cache line will be located.

Some interleave schemes are designed such that only DIMM resources of the same capacity and architecture are interleaved together. In configurations having DIMMs of multiple capacities and architectures populated within a memory system, the basic input/output system (BIOS) and memory controller of the information handling system 100 can create and configure a separate interleave group for each DIMIM capacity and/or architecture type. An interleaving group can be spread across CPUs, across memory controllers, across DDR channels, across DIMMs within a channel, across ranks per DIMM, and in various combinations thereof.

A rank of a memory system can include a set of DRAM devices that are accessed simultaneously in order to access a required data width, such as 72 bits wide on information handling systems that support memory error correction code (ECC) coding, or 64 bits wide on information handling systems that do not support ECC coding, though other widths are also possible. Multiple DRAM devices are needed to form a rank when the DRAM devices have widths of 4-bits, 8-bits, 16-bits, and 32-bits. Other memory devices widths and channel data widths are possible.

Internal to a DRAM, memory is organized in multiple banks, with common numbers of 4, 8, 16, and 32 banks per DRAM today. Banks provide sub-DRAM granularity to the overall system cache line addressing. Currently, a bank can only accept a single memory operation at a time, so a bank address is the lowest level that could be used by an interleaving scheme. In an embodiment, a DIMM may have 8 ranks per DIMM, and 16 banks per rank, and thus 128 addressable banks per DIMM.

In the illustrated embodiment of FIG. 1, the information handling system 100 includes a central processing unit (CPU) 110, the DDR channels 102, 104, 106, and 108, and DIMMs 120, 121, 122, 123, and 124. A system host memory controller or the CPU 110 can maximize performance of the memory subsystem of DIMMs on the DDR channels 102, 104, 106, and 108 by performing memory interleaving. The performance of the memory subsystem can be maximized in response to the memory controller minimizing average and peak memory latency during accesses to the DIMMs. A memory controller implementing typical memory interleaving can group the DIMMs 120-124 into two interleave groups. For the illustrated embodiment of FIG. 1, DIMMs 120-124 are assumed to all have the same capacity and organization, such as the same DIMM capacity, number of ranks, and 16 banks per rank. In other embodiments, the number of banks per DIMM, ranks per DIMM, capacity per DIMM can all be different and the interleaving discussed herein can be maintained.

In the configuration of FIG. 1, DIMMs 120-123 can be grouped into a first interleave group, and DIMM 124 can be placed in a second interleave group. Thus, all of the ranks and banks within DIMMs 120-123 are included in the first interleave group, and all of the ranks and banks within DIMM 124 are included in the second interleave group as shown in Table 1 below.

TABLE 1

| | Interleave Groups | | | |
|---|---|---|---|---|
| Channel | 102 | 104 | 106 | 108 |
| DIMM | 124 | | | |
| Bank 15 | 16 | | | |
| Bank 14 | 15 | | | |
| Bank 13 | 14 | | | |
| Bank 12 | 13 | | | |
| Bank 11 | 12 | | | |
| Bank 10 | 11 | | | |
| Bank 9 | 10 | | | |
| Bank 8 | 9 | | | |
| Bank 7 | 8 | | | |
| Bank 6 | 7 | | | |
| Bank 5 | 6 | | | |
| Bank 4 | 5 | | | |
| Bank 3 | 4 | | | |
| Bank 2 | 3 | | | |
| Bank 1 | 2 | | | |
| Bank 0 | 1 | | | |
| DIMM | 120 | 121 | 122 | 123 |
| Bank 15 | 61 | 62 | 63 | 64 |
| Bank 14 | 57 | 58 | 59 | 60 |
| Bank 13 | 53 | 54 | 55 | 56 |
| Bank 12 | 49 | 50 | 51 | 52 |
| Bank 11 | 45 | 46 | 47 | 48 |
| Bank 10 | 41 | 42 | 43 | 44 |
| Bank 9 | 37 | 38 | 39 | 40 |
| Bank 8 | 33 | 34 | 35 | 36 |
| Bank 7 | 29 | 30 | 31 | 32 |
| Bank 6 | 25 | 26 | 27 | 28 |
| Bank 5 | 21 | 22 | 23 | 24 |
| Bank 4 | 17 | 18 | 19 | 20 |
| Bank 3 | 13 | 14 | 15 | 16 |
| Bank 2 | 9 | 10 | 11 | 12 |
| Bank 1 | 5 | 6 | 7 | 8 |
| Bank 0 | 1 | 2 | 3 | 4 |

This memory interleaving can provide the most efficient performance for the first interleave group, but the second interleave group has a highly ineffective performance. For example, the first interleave group can have 100% of the memory bandwidth by interleaving consecutive cache line block accesses to a different DIMM on a different DDR channel. In this example, cache memory accesses by the CPU 110 can proceed through the DDR channels, such that order of accesses can include first DIMM 120 on DDR channel 102, then DIMM 121 on DDR channel 104, then DIMM 122 on DDR channel 106, and then DIMM 123 on DDR channel 108. Thus, accesses to memory locations in the first interleave group involves 100% of the DDR channels 102-108, such that bandwidth or performance level for the first interleave group can be 100%.

However, the performance level of the second interleave group may be only 25% based on all memory accesses to this group are to the DIMM 124 on the DDR channel 102, such that three of the four DDR channels are not utilized in the second interleave group. The overall performance of the memory system made up of CPU 110 and DIMMs 120-124 on the DDR channels 102-108 of the CPU can be calculated using equation 1 below:

$$OverallPerformance = Performance_{Group1} * \frac{Banks_{Group1}}{Banks_{Total}} + Performance_{Group2} * \frac{Banks_{Group2}}{Banks_{Total}} \quad \text{EQ. 1}$$

In this example, each of the DIMMs 120-124 includes 16 banks per rank, such that the first interleave group has 64 banks per rank, the second interleave group has 16 banks per rank, and the entire memory subsystem has 80 banks per rank. Thus, using the performances for the first and second groups discussed above and the number of banks for the first and second interleave groups, the overall performance of the first and second interleave groups is 85%. However, the performance between the two interleave group is inconsistent, such that the bandwidth and latency for an access varies depending on the interleave group that the access is associated with.

In an embodiment, the memory controller can implement memory interleaving of the DIMMs 120-124 in such a way as to make the performance levels of the two interleave groups be statistically equal. The CPU 110 can implement equal performance levels by allocating each interleave group access to memory locations on each DDR channel 102-108. For example, each interleave group can span across all of the memory channels 102-108. In an embodiment, the CPU 110 can allocate each interleave group all of the banks of a single DIMM on any DDR channel having multiple DIMMs. For example, the first interleave group can include all banks of DIMM 120, and the second interleave group can include all of the banks of DIMM 124 both of which are on memory channel 102. The memory controller can then divide the banks of the remaining DIMMs 121-123 in half, such that each interleave group includes half of the banks of each of these DIMMs. For example, the first interleave group can include all 16 banks of DIMM 120, and banks 0-7 of DIMMs 121-123, and the second interleave group can include all 16 banks of DIMM 124 and banks 8-15 of DIMMs 121-123 as shown in Table 2 below.

TABLE 2

| | Interleave groups | | | |
|---|---|---|---|---|
| Channel | 102 | 104 | 106 | 108 |
| DIMM | 124 | | | |
| Bank 15 | 40 | | | |
| Bank 14 | 35 | | | |
| Bank 13 | 30 | | | |
| Bank 12 | 25 | | | |
| Bank 11 | 20 | | | |
| Bank 10 | 15 | | | |
| Bank 9 | 10 | | | |
| Bank 8 | 5 | | | |
| Bank 7 | 38 | | | |
| Bank 6 | 33 | | | |
| Bank 5 | 28 | | | |
| Bank 4 | 23 | | | |
| Bank 3 | 18 | | | |
| Bank 2 | 13 | | | |
| Bank 1 | 8 | | | |
| Bank 0 | 3 | | | |
| DIMM | 120 | 121 | 122 | 123 |
| Bank 15 | 40 | 36 | 39 | 37 |
| Bank 14 | 35 | 31 | 34 | 32 |
| Bank 13 | 30 | 26 | 29 | 27 |
| Bank 12 | 25 | 21 | 25 | 22 |
| Bank 11 | 20 | 16 | 19 | 17 |
| Bank 10 | 15 | 11 | 14 | 12 |
| Bank 9 | 10 | 6 | 9 | 7 |
| Bank 8 | 5 | 1 | 4 | 2 |
| Bank 7 | 38 | 36 | 39 | 37 |
| Bank 6 | 33 | 31 | 34 | 32 |
| Bank 5 | 28 | 26 | 29 | 27 |
| Bank 4 | 23 | 21 | 25 | 22 |
| Bank 3 | 18 | 16 | 19 | 17 |
| Bank 2 | 13 | 11 | 14 | 12 |
| Bank 1 | 8 | 6 | 9 | 7 |
| Bank 0 | 3 | 1 | 4 | 2 |

As shown in Table 2 above, the accesses to caches lines can be scattered across the DDR channels. For example, the first cache line access is addressed to Bank0 of DIMM 121, the second access is to Bank0 of DIMM 123, the third access is to Bank0 of DIMM 120, the fourth access is to Bank0 of DIMM 122, and the fifth access is to Bank8 of DIMM 120. In this example, the performance level of a memory subsystem having scattered access to the cache lines can be higher than a memory subsystem without scattered access because consecutive accesses are not to the same DIMM or DDR channel. The bandwidth for memory accesses can be higher when all of the DDR channels are being utilized. In other embodiments, other scattering schemes other than the example give in Table 2 above can be used. In an embodiment, the more random the scattering between DIMMs and DDR channels the more intensive the gate count in a memory controller. In one embodiment, the memory controller can scatter the cache lines in a pseudo-random manner.

In an embodiment, the bandwidth and therefore performance available for accesses to memory locations of an interleave group is based on the bank being accessed. For example, in the first interleave group, accesses to banks 0-7 of DIMMS 120-123 have 100% of the bandwidth of the memory subsystem based on consecutive accesses being directed to a different DDR channel. However, accesses to banks 8-15 of the first interleave group are limited to 25% of the bandwidth, because DIMM 120 on DDR channel 102 is the only DIMM allocated for to the first interleave group for accesses to banks 8-15. Therefore, the overall performance of the first interleave group can be calculated using equation 1 above. Thus, the first interleave group has 100% bandwidth/performance for accesses to 32 banks of the 40 total banks (banks 0-7 on DIMMs 120-123) allocated to the first interleave group, and has 25% bandwidth/performance for accesses to 8 banks of the 40 total banks (banks 8-15 on DIMM 120). Using these numbers in equation 1 above, results in an overall performance of 85% for the first interleave group.

The second interleave group has 100% of the bandwidth of the memory subsystem for accesses to banks 8-15 of DIMMS 121-124 based on consecutive accesses being directed to a different DDR channel. However, accesses to banks 0-7 of the second interleave group are limited to 25% of the bandwidth, because DIMM 124 on DDR channel 102 is the only DIMM allocated for to the second interleave group for accesses to banks 0-7. Therefore, the overall performance of the second interleave group can be calculated using equation 1 above. Thus, the first interleave group has 100% bandwidth/performance for accesses to 32 banks of the 40 total banks (banks 8-15 on DIMMs 121-124) allocated to the second interleave group, and has 25% bandwidth/performance level for accesses to 8 banks of the 40 total banks (banks 0-7 on DIMM 124). Using these numbers in equation 1 above, results in an overall performance of 85% for the second interleave group.

The overall performance for the entire memory subsystem using this memory interleaving implementation is 85% based on equal 1 above, and each interleave group having the same number of banks and the same performance of 85%. Therefore, when the DIMMs 120-124 are non-symmetrically populated on DDR channels 102-108, such that not all of the memory channels have the same number of DIMMs, the bandwidth and latency can be consistent between interleave groups by allocating each interleave group access to memory locations on all of the DDR channels. The consistency between interleave groups enables queue delays and other resources or operations associated with access to the DIMMs 120-124 to be the same no matter which interleave group is being accessed.

In other embodiments, if DIMMs 120-124 are of differing capacities, it is possible to divide the total number of banks into two interleave groups of equal or substantially equal halves, such that each half has the same number of banks scattered across the available DIMM channels. In an embodiment, the splitting of banks can be on a rank basis, or can span across multiple ranks, so long as the division maintains the characteristic that each half has statistically similar or same numbers of banks and associated access to the available channels.

In an embodiment, the DIMMs 120-124 can have a different number of ranks as compared to the other DIMMs. For example, DIMM 120 can include 2 ranks with 16 banks in each rank for a total of 32 banks, DIMM 121 can include 1 rank with 16 banks, DIMM 122 can include 2 ranks with 16 banks in each rank for a total of 32 banks, DIMM 123 can include 1 rank with 16 banks, and DIMM 124 can include 2 ranks with 16 banks in each rank for a total of 32 banks. In this embodiment, the memory controller can implement memory interleaving of the DIMMs 120-124 in such a way as to make the performance levels of the two interleave groups be statistically equal. The CPU 110 can implement equal performance levels by allocating each interleave group access to memory locations from banks across ranks of DIMMs on each DDR channel 102-108. For example, each interleave group can span across all of the memory channels 102-108. In an embodiment, the CPU 110 can allocate each interleave group all of the banks in the ranks of a single DIMM on any DDR channel having multiple DIMMs. For example, the first interleave group can include all banks of the two ranks of DIMM 120, and the second interleave group can include all of the banks of the two ranks of DIMM 124 both of which are on memory channel 102. The memory controller can then divide the banks of the remaining DIMMs 121-123 in half, such that each interleave group includes half of the banks of each of these DIMMs without maintaining that all of the banks in a rank are in the same interleave group. For example, the first interleave group can include all 32 banks of DIMM 120, banks 0-7 of DIMMs 121 and 123, and banks 0-7 and 24-31 of DIMM 122, and the second interleave group can include all 32 banks of DIMM 124, ranks 8-15 of DIMMs 121 and 123, and banks 8-23 of DIMM 122 as shown in Table 3 below.

TABLE 3

| | Interleave Groups | | | |
|---|---|---|---|---|
| Channel | 102 | 104 | 106 | 108 |
| DIMM | 124 | | | |
| Bank 31 | 64 | | | |
| Bank 30 | 56 | | | |
| Bank 29 | 48 | | | |
| Bank 28 | 40 | | | |
| Bank 27 | 32 | | | |
| Bank 26 | 24 | | | |
| Bank 25 | 16 | | | |
| Bank 24 | 8 | | | |
| Bank 23 | 62 | | | |
| Bank 22 | 54 | | | |
| Bank 21 | 46 | | | |
| Bank 20 | 38 | | | |
| Bank 19 | 30 | | | |
| Bank 18 | 22 | | | |
| Bank 17 | 14 | | | |
| Bank 16 | 6 | | | |
| Bank 15 | 60 | | | |
| Bank 14 | 52 | | | |
| Bank 13 | 44 | | | |
| Bank 12 | 36 | | | |
| Bank 11 | 28 | | | |
| Bank 10 | 20 | | | |
| Bank 9 | 12 | | | |
| Bank 8 | 4 | | | |
| Bank 7 | 58 | | | |
| Bank 6 | 50 | | | |
| Bank 5 | 42 | | | |
| Bank 4 | 34 | | | |
| Bank 3 | 26 | | | |
| Bank 2 | 18 | | | |
| Bank 1 | 10 | | | |
| Bank 0 | 2 | | | |
| DIMM | 120 | 121 | 122 | 123 |
| Bank 31 | 64 | | 63 | |
| Bank 30 | 56 | | 55 | |
| Bank 29 | 48 | | 47 | |
| Bank 28 | 40 | | 39 | |
| Bank 27 | 32 | | 31 | |
| Bank 26 | 24 | | 23 | |
| Bank 25 | 16 | | 15 | |
| Bank 24 | 8 | | 7 | |
| Bank 23 | 62 | | 63 | |
| Bank 22 | 54 | | 55 | |
| Bank 21 | 46 | | 47 | |
| Bank 20 | 38 | | 39 | |
| Bank 19 | 30 | | 31 | |
| Bank 18 | 22 | | 23 | |
| Bank 17 | 14 | | 15 | |
| Bank 16 | 6 | | 7 | |
| Bank 15 | 60 | 57 | 59 | 61 |
| Bank 14 | 52 | 49 | 51 | 53 |
| Bank 13 | 44 | 41 | 43 | 45 |
| Bank 12 | 36 | 33 | 35 | 37 |
| Bank 11 | 28 | 25 | 27 | 29 |
| Bank 10 | 20 | 17 | 19 | 21 |
| Bank 9 | 12 | 9 | 11 | 13 |
| Bank 8 | 4 | 1 | 3 | 5 |
| Bank 7 | 58 | 57 | 59 | 61 |
| Bank 6 | 50 | 49 | 51 | 53 |
| Bank 5 | 42 | 41 | 43 | 45 |
| Bank 4 | 34 | 33 | 35 | 37 |
| Bank 3 | 26 | 25 | 27 | 29 |
| Bank 2 | 18 | 17 | 19 | 21 |
| Bank 1 | 10 | 9 | 11 | 13 |
| Bank 0 | 2 | 1 | 3 | 5 |

As shown in Table 3 above, the accesses to caches lines can be scattered across the DDR channels. For example, the first cache line access is addressed to Bank0 of DIMM 121, the second access is to Bank0 of DIMM 120, the third access is to Bank0 of DIMM 122, the fourth access is to Bank0 of DIMM 123, and the fifth access is to Bank8 of DIMM 120. In this example, the performance level of a memory subsystem having scattered access to the cache lines can be higher than a memory subsystem without scattered access because consecutive accesses are not to the same DIMM or DDR channel. The bandwidth for memory accesses can be higher when all of the DDR channels are being utilized. In other embodiments, other scattering schemes other than the example give in Table 3 above can be used.

In an embodiment, the bandwidth and therefore performance available for accesses to memory locations of an interleave group is based on the bank being accessed. For example, in the first interleave group, accesses to banks 0-7 of DIMMS 120-123 have 100% of the bandwidth of the memory subsystem based on consecutive accesses being directed to a different DDR channel. However, accesses to banks 8-23 of the first interleave group are limited to 25% of the bandwidth, because DIMM 120 on DDR channel 102 is the only DIMM allocated for to the first interleave group for accesses to banks 8-23. Also, accesses to banks 24-31 of the first interleave group are limited to 50% of the bandwidth, because DIMM 120 on DDR channel 102 and DIMM 122 on DDR channel 106 are the two DIMMs allocated for to the first interleave group for accesses to banks 24-31. Therefore, the overall performance of the first interleave group can be calculated using equation 1 above.

Thus, the first interleave group has 100% bandwidth/performance for accesses to 32 banks of the 64 total banks (banks 0-7 on DIMMs 120-123) allocated to the first interleave group, has 25% bandwidth/performance for accesses to 16 banks of the 64 total banks (banks 8-23 on DIMM 120), and has 50% bandwidth/performance for accesses to 16 banks of the 64 total banks (banks 24-32 on DIMMs 120 and 122). Using these numbers in equation 1 above, results in an overall performance of 68.75% for the first interleave group.

The second interleave group has 100% of the bandwidth of the memory subsystem for accesses to banks 8-15 of DIMMS 121-124 based on consecutive accesses being directed to a different DDR channel. However, accesses to banks 0-7 and banks 24-31 of the second interleave group are limited to 25% of the bandwidth, because DIMM 124 on DDR channel 102 is the only DIMM allocated for to the second interleave group for accesses to banks 0-7 and banks 24-31. Accesses to banks 16-23 of the second interleave group are limited to 50% of the bandwidth, because DIMM 124 on DDR channel 102 and DIMM 122 on DDR channel 106 are the two DIMMs allocated for to the second interleave group for accesses to banks 16-23. Therefore, the overall performance of the second interleave group can be calculated using equation 1 above. Thus, the first interleave group has 100% bandwidth/performance for accesses to 32 banks of the 64 total banks (banks 8-15 on DIMMs 121-124) allocated to the second interleave group, has 25% bandwidth/performance level for accesses to 16 banks of the 64 total banks (banks 0-7 and 24-31 on DIMM 124), and has 50% bandwidth/performance level for accesses to 16 banks of the 64 total banks (banks 16-23 on DIMMs 124 and 122). Using these numbers in equation 1 above, results in an overall performance of 68.75% for the second interleave group.

The overall performance for the entire memory subsystem using this memory interleaving implementation is 68.75% based on equation 1 above, and each interleave group having the same number of banks and the same performance of 68.75%. Therefore, when the DIMMs 120-124 are non-symmetrically populated on DDR channels 102-108, such that not all of the memory channels have the same number of DIMMs, the bandwidth and latency can be consistent between interleave groups by allocating each interleave group access to memory locations on all of the DDR channels. The consistency between interleave groups enables queue delays and other resources or operations associated with access to the DIMMs 120-124 to be the same no matter which interleave group is being accessed.

This example of the interleaving of the banks has been described with respect to DIMMs 120-124 having different number of ranks. As discussed above, the number of banks per DIMM, ranks per DIMM, capacity per DIMM can all be different and the interleaving discussed herein can be maintained as shown in the discussion of Table 3 above. However, for simplicity, all of the examples discussed below, with respect to FIGS. 2-7, include the same DIMM capacity, the same ranks per DIMM, and the same number of banks per DIMM. Additionally, the number of interleaving groups can vary, such that the number of interleaving groups does not need to be two interleaving groups. In an embodiment with more than two interleaving groups, the processor 110 can determine the number of interleaving groups to be created, divide the total number of banks by the number of groups to determine the number of banks for each interleaving group, and then divide the banks as substantially even as possible across each DDR channel for the groups. For example, if the memory subsystem includes 80 total banks and 4 interleaving groups are to be made, each interleaving group should include 20 banks.

Figure 2:
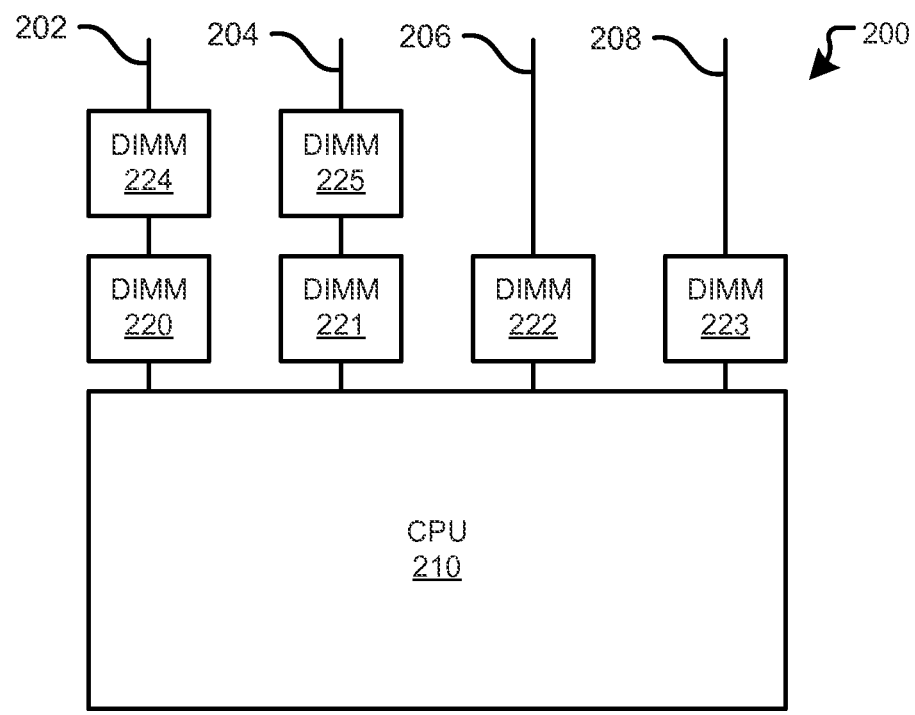

FIG. 2 shows an embodiment of an information handling system 200 including four DDR channels 202, 204, 206, and 208, a CPU 210, and six DIMMs 220, 221, 222, 223, 224, and 225 populated on the DDR channels. In this embodiment, the DIMMs 220-225 are non-symmetrically populated on the DDR channels 202-208 based on DDR channels 202 and 204 having two DIMMs while DDR channels 206 and 208 only having one DIMM. In an embodiment, memory interleaving can be implemented as described above to enable bandwidth and performance consistency between interleave groups. For example, the CPU 210 can implement equal performance levels by allocating each interleave group access to memory locations on each DDR channel 202-208.

In an embodiment, the CPU 210 can allocate each interleave group all of the banks of a single DIMM on any DDR channel having multiple DIMMs. For example, DIMMs 220 and 224 are both populated on memory channel 202, and DIMMs 221 and 225 are both populated on memory channel 204. In this example, the first interleave group can include all the banks of DIMMs 220 and 221, and the second interleave group can include all of the banks of DIMMs 224 and 225. The memory controller can then divide the banks of the remaining DIMMs 222-223 in half, such that each interleave group includes banks of each of these DIMMs. For example, the first interleave group can include banks 0-7 of DIMMs 222 and 223, and the second interleave group can include banks 8-15 of DIMMs 222 and 223. Therefore, the first interleave group includes all 16 banks of DIMM 220 and all 16 banks of DIMM 221, and banks 0-7 of DIMMs 222 and 223, and the second interleave group can include all 16 banks of DIMM 124 and all 16 banks of DIMM 224, and banks 8-15 of DIMMs 222 and 223.

In this embodiment, the bandwidth and therefore performance available for accesses to memory locations of an interleave group is based on the bank being accessed. For example, in the first interleave group, accesses to banks 0-7 of DIMMS 220-223 have 100% of the bandwidth of the memory subsystem based on consecutive accesses being directed to a different DDR channel. However, accesses to banks 8-15 of the first interleave group are limited to 50% of the bandwidth, because accesses to these banks are limited to DIMM 220 on DDR channel 202 and DIMM 221 on DDR channel 204. Therefore, the overall performance of the first interleave group can be calculated using equation 1 above. Thus, the first interleave group has 100% bandwidth/performance for accesses to 32 banks of the 48 total banks (banks 0-7 on DIMMs 220-223) allocated to the first interleave group, and has 50% bandwidth/performance for accesses to 16 banks of the 48 total banks (banks 8-15 on DIMMs 220 and 221). Using these numbers in equation 1 above, results in an overall performance of 83.33% for the first interleave group.

The second interleave group has 100% of the bandwidth of the memory subsystem for accesses to banks 8-15 of DIMMS 222-225 based on consecutive accesses being directed to a different DDR channel. However, accesses to banks 0-7 of the second interleave group are limited to 50% of the bandwidth, because accesses to these banks are limited to DIMM 224 on DDR channel 202 and DIMM 225 on DDR channel 204. Therefore, the overall performance of the second interleave group can be calculated using equation 1 above. Thus, the first interleave group has 100% bandwidth/performance for accesses to 32 banks of the 48 total banks (banks 8-15 on DIMMs 222-225) allocated to the second interleave group, and has 50% bandwidth/performance level for accesses to 16 banks of the 48 total banks (banks 0-7 on DIMMs 224 and 225). Using these numbers in equation 1 above, results in an overall performance of 83.33% for the second interleave group. The overall performance for the entire memory subsystem using this interleaving implementation is 83.33% based on equal 1 above, and each interleave group having the same number of banks and the same performance level.

Figure 3:
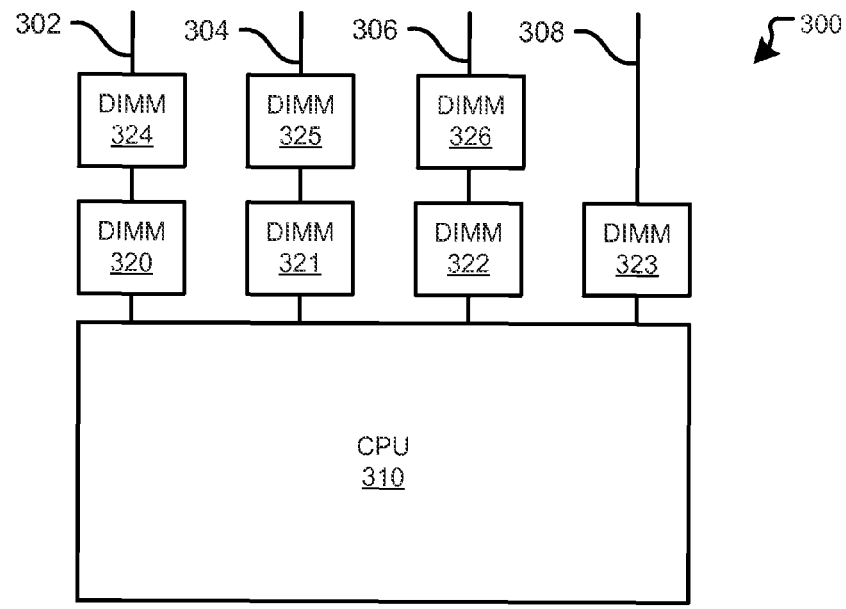

FIG. 3 shows an embodiment of an information handling system 300 including four DDR channels 302, 304, 306, and 308, a CPU 310, and seven DIMMs 320, 321, 322, 323, 324, 325, and 326 populated on the DDR channels. In this embodiment, the DIMMs 320-326 are non-symmetrically populated on the DDR channels 302-308 based on DDR channels 302, 304, and 306 having two DIMMs while DDR channel 308 only having one DIMM. In an embodiment, memory interleaving can be implemented as described above to enable bandwidth and performance consistency between interleave groups. For example, the CPU 310 can implement equal performance levels by allocating each interleave group access to memory locations on each DDR channel 302-308.

In an embodiment, the CPU 310 can allocate each interleave group all of the banks of a single DIMM on any DDR channel having multiple DIMMs. For example, a first interleave group can include all the banks of DIMMs 320, 321, and 322, and a second interleave group can include all of the banks of DIMMs 324, 325, and 326. The memory controller can then divide the banks of the DIMM 323 in half, such that each interleave group includes banks of each of these DIMMs. For example, the first interleave group can include banks 0-7 of DIMM 323, and the second interleave group can include banks 8-15 of DIMM 323. Therefore, the first interleave group includes all 16 banks of DIMM 320, all 16 banks of DIMM 321, all 16 banks of DIMM 322, and banks 0-7 of DIMMs 323, and the second interleave group can include all 16 banks of DIMM 324, all 16 banks of DIMM 325, all 16 banks of DIMM 326, and banks 8-15 of DIMM 323.

In this embodiment, the bandwidth and therefore performance available for accesses to memory locations of an interleave group is based on the bank being accessed. For example, in the first interleave group, accesses to banks 0-7 of DIMMS 320-323 have 100% of the bandwidth of the memory subsystem based on consecutive accesses being directed to a different DDR channel. However, accesses to banks 8-15 of the first interleave group are limited to 70% of the bandwidth, because accesses to these banks are limited to DIMM 320 on DDR channel 302, DIMM 321 on DDR channel 304, and DIMM 322 on DDR channel 306. Therefore, the overall performance of the first interleave group can be calculated using equation 1 above. Thus, the first interleave group has 100% bandwidth/performance for accesses to 32 banks of the 56 total banks (banks 0-7 on DIMMs 320-323) allocated to the first interleave group, and has 75% bandwidth/performance for accesses to 24 banks of the 56 total banks (banks 8-15 on DIMMs 320-322). Using these numbers in equation 1 above, results in an overall performance of 89.29% for the first interleave group.

The second interleave group has 100% of the bandwidth of the memory subsystem for accesses to banks 8-15 of DIMMS 323-326 based on consecutive accesses being directed to a different DDR channel. However, accesses to banks 0-7 of the second interleave group are limited to 75% of the bandwidth, because accesses to these banks are limited to DIMM 324 on DDR channel 302, DIMM 325 on DDR channel 304, and DIMM 326 on DDR channel 306. Therefore, the overall performance of the second interleave group can be calculated using equation 1 above. Thus, the first interleave group has 100% bandwidth/performance for accesses to 32 banks of the 56 total banks (banks 8-15 on DIMMs 223-226) allocated to the second interleave group, and has 75% bandwidth/performance level for accesses to 24 banks of the 56 total banks (banks 0-7 on DIMMs 224-226). Using these numbers in equation 1 above, results in an overall performance of 89.29% for the second interleave group. The overall performance for the entire memory subsystem using this interleaving implementation is 89.29% based on equal 1 above, and each interleave group having the same number of banks and the same performance level.

Figure 4:
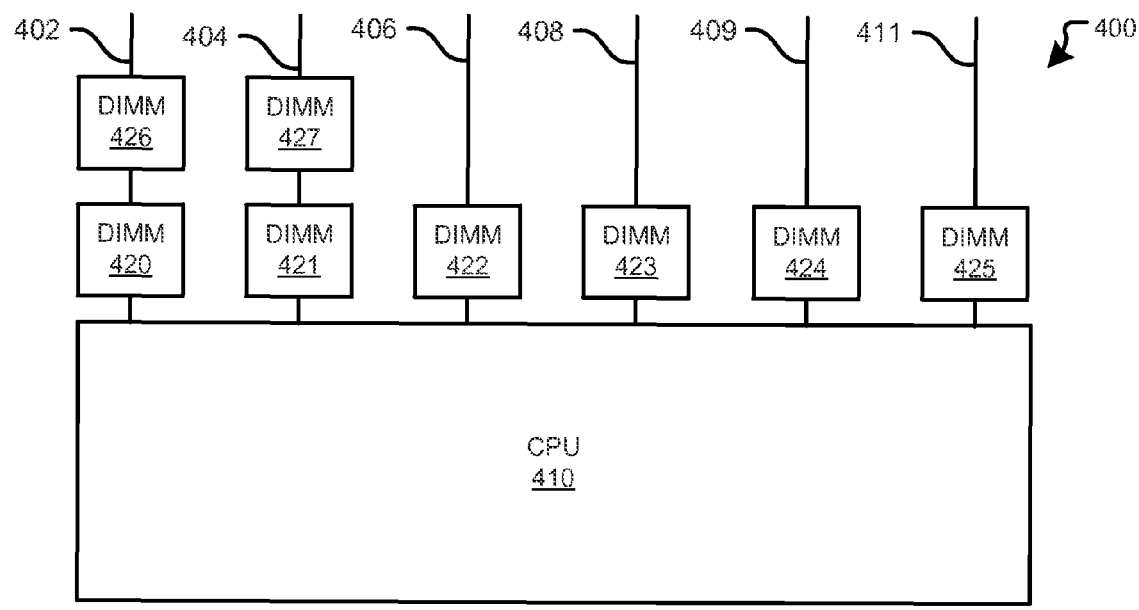

FIG. 4 shows an embodiment of an information handling system 400 including six DDR channels 402, 404, 406, 408, 409, and 411, a CPU 410, and eight DIMMs 420, 421, 422, 423, 424, 425, 426, and 427 populated on the DDR channels. In this embodiment, the DIMMs 420-427 are non-symmetrically populated on the DDR channels 402-411 based on DDR channels 402 and 404 having two DIMMs while DDR channels 408, 409, and 411 only having one DIMM. In an embodiment, memory interleaving can be implemented as described above to enable bandwidth and performance consistency between interleave groups. For example, the first interleave group includes all 16 banks of DIMM 420, all 16 banks of DIMM 421, and banks 0-7 of DIMMs 423-425, and the second interleave group can include all 16 banks of DIMM 426, all 16 banks of DIMM 427, and banks 8-15 of DIMMs 423-425.

In this embodiment, the bandwidth and therefore performance available for accesses to memory locations of an interleave group is based on the bank being accessed. For example, in the first interleave group, accesses to banks 0-7 of DIMMS 420-425 have 100% of the bandwidth of the memory subsystem based on consecutive accesses being directed to a different DDR channel. However, accesses to banks 8-15 of the first interleave group are limited to 33.33% of the bandwidth, because accesses to these banks are limited to DIMM 420 on DDR channel 402 and DIMM 421 on DDR channel 404. The second interleave group has 100% of the bandwidth of the memory subsystem for accesses to banks 8-15 of DIMMS 423-427 based on consecutive accesses being directed to a different DDR channel.

However, accesses to banks 0-7 of the second interleave group are limited to 33.33% of the bandwidth, because accesses to these banks are limited to DIMM 426 on DDR channel 402, and DIMM 427 on DDR channel 404. Therefore, the overall performance of the first interleave group can be calculated using equation 1 above. Thus, both interleave groups has 100% bandwidth/performance for accesses to 48 banks of the 64 total banks, and has 33.33% bandwidth/performance for accesses to 16 banks of the 64 total banks. Using these numbers in equation 1 above, results in an overall performance of 83.33% for the first interleave group. Similarly, the overall performance for the entire memory subsystem using this interleaving implementation is 83.33% based on equal 1 above, and each interleave group having the same number of banks and the same performance level.

Figure 5:
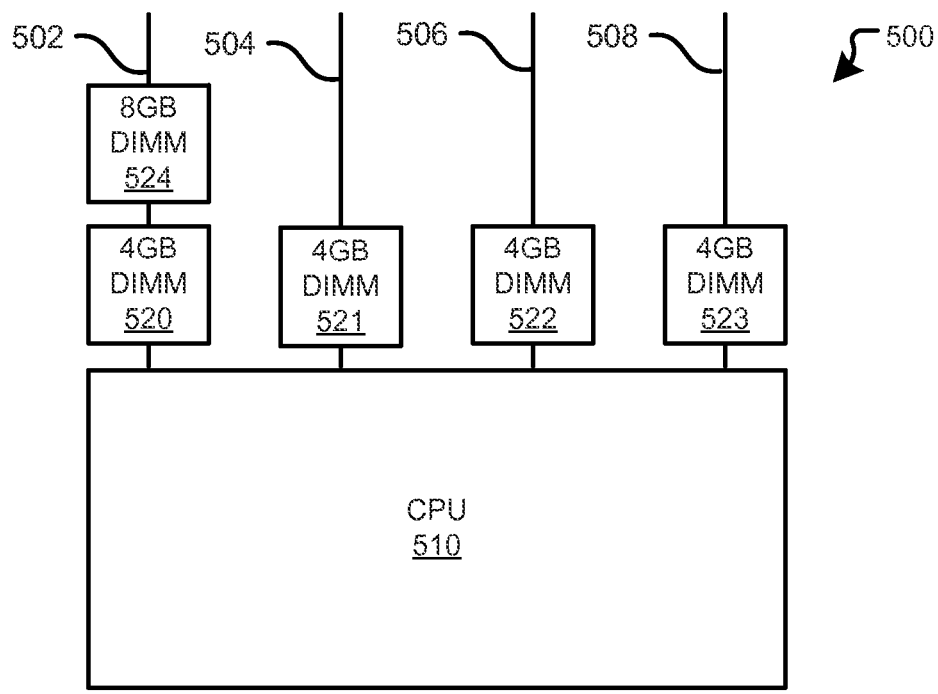

FIG. 5 shows an embodiment of an information handling system 500 including four DDR channels 502, 504, 506, and 508, a CPU 510, and five DIMMs 520, 521, 522, 523, and 524 populated on the DDR channels. In this embodiment, the DIMMs 520-524 are non-symmetrically populated on the DDR channels 502-508 based on DDR channel 502 having two DIMMs while DDR channels 504, 506, and 508 only having one DIMM. Additionally, the DIMMs are non-symmetrically populated based on the DIMMs having different sizes. For example, DIMMs 520-523 can be 4 GB DIMMs while DIMM 524 can be an 8 GB DIMM. The partial banks sets from each DIMM 520-524 can be allocated to different interleave groups as described above to enable bandwidth and performance level consistency between interleave groups. Thus, as described above the different interleave groups can include banks of memory for cache line accesses from each DDR channel 502-508.

Figure 6:
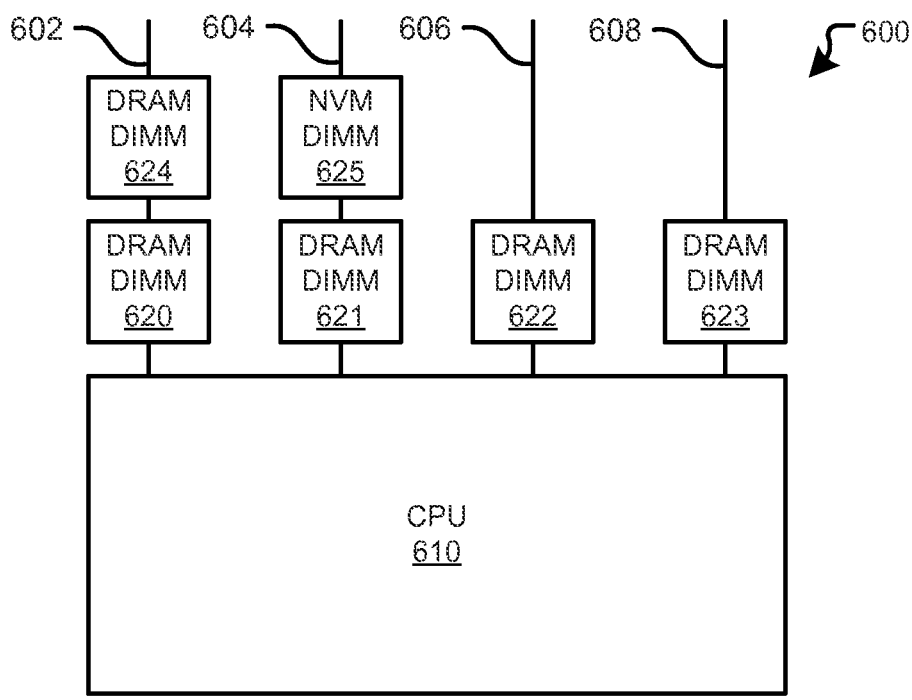

FIG. 6 shows an embodiment of an information handling system 600 including four DDR channels 602, 604, 606, and 608, a CPU 610, and six DIMMs 620, 621, 622, 623, 624, and 625 populated on the DDR channels. In this embodiment, the DIMMs 620-625 are non-symmetrically populated on the DDR channels 602-608 based on DDR channels 602 and 604 having two DIMMs while DDR channels 606 and 608 only having one DIMM. Additionally, the DIMMs are non-symmetrically populated based on the DIMMs being different DIMM type. For example, DIMMs 620-624 can be DRAM DIMMs while DIMM 625 can be an NVM DIMM. In this embodiment, the CPU 610 or memory controller can determine that DIMM 625 is a different type of DIMM than DIMMs 620-624. In this embodiment, the CPU610 the can allocate DIMM 625 into is own interleave group, and can allocate the remaining DIMMs 620-624 into two additional interleave groups in the same manner as described above. Thus, in this embodiment, the information handling system or memory subsystem 600 can include more than two interleave groups and the allocation of banks of DIMMs may not be evenly distributed between all of the interleave groups.

Figure 7:
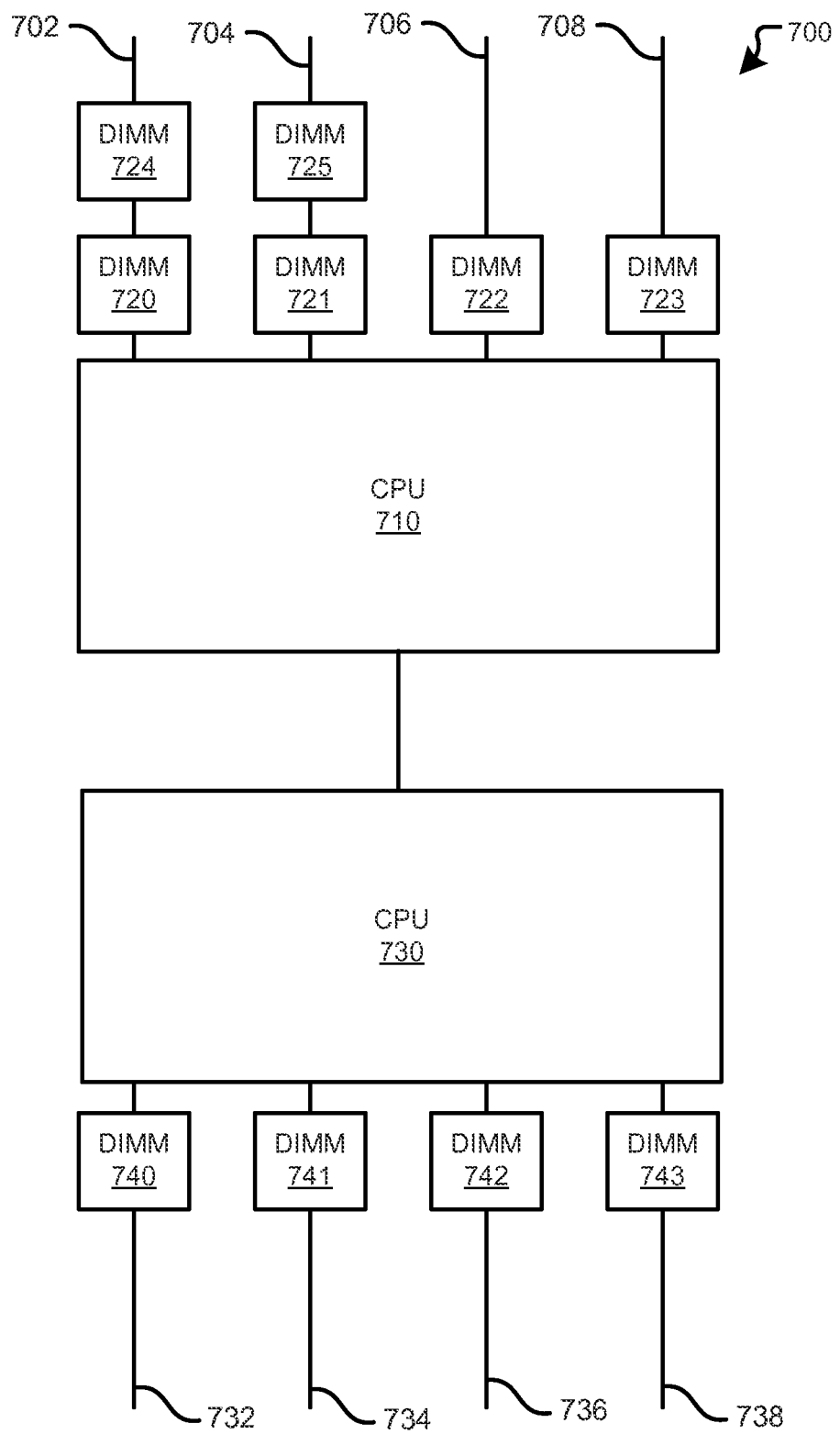

FIG. 7 shows an embodiment of an information handling system 700 including CPUs 710 and 730 both of which have four DDR channels. The CPU 710 can include DDR channels 702, 704, 706, and 708, and six DIMMs 720, 721, 722, 723, 724, and 725 populated on the DDR channels. In this embodiment, the DIMMs 720-725 are non-symmetrically populated on the DDR channels 702-708 based on DDR channels 702 and 704 having two DIMMs while DDR channels 706 and 708 only having one DIMM. The CPU 730 can include DDR channels 732, 734, 736, and 738, and six DIMMs 740, 741, 742, 743, 744, and 745 populated on the DDR channels. In this embodiment, the DIMMs 740-743 are symmetrically populated on the DDR channels 732-738.

In an embodiment, the DIMMs 720-725 on CPU 710 can be interleaved into two evenly distributed interleave groups as described in the above embodiments above in response to the DIMMs being non-symmetrically populated on the DDR channels 702-708. However, the DIMMs 740-743 can be interleaved according to typical interleaving methods, such that all of the banks of all of the DIMMs are allocated into a single interleave group based on these DIMMs being symmetrically populated on the DDR channels 740-743. Thus, the two different memory subsystems of CPU 710 and CPU 730 can be interleaved according to different methods based on how the DIMMs are populated on the DDR channels of the CPUs.

In different embodiments, the memory interleaving DIMMs that are non-symmetrically populated on DDR channels of a CPU can be enabled or disabled based on requests from a user. For example, if a user would like to have an interleave group with the highest possible bandwidth and performance levels, the user can request to disable interleaving with even distribution of non-symmetrically populated DIMMs. In response to this request, one interleaving group can have a high bandwidth and performance level while other interleaving groups may have lower bandwidth and performance levels. However, if a user would like to have all of the interleave groups to have the same bandwidth and performance levels, the user can request to enable interleaving with even distribution of non-symmetrically populated DIMMs. In response to the enable request, one interleave group may have a lower bandwidth and performance level than possible with another interleaving implementation, but the bandwidth and performance of each of the interleave groups can be higher than possible with the other interleaving implementation.

Figure 8:
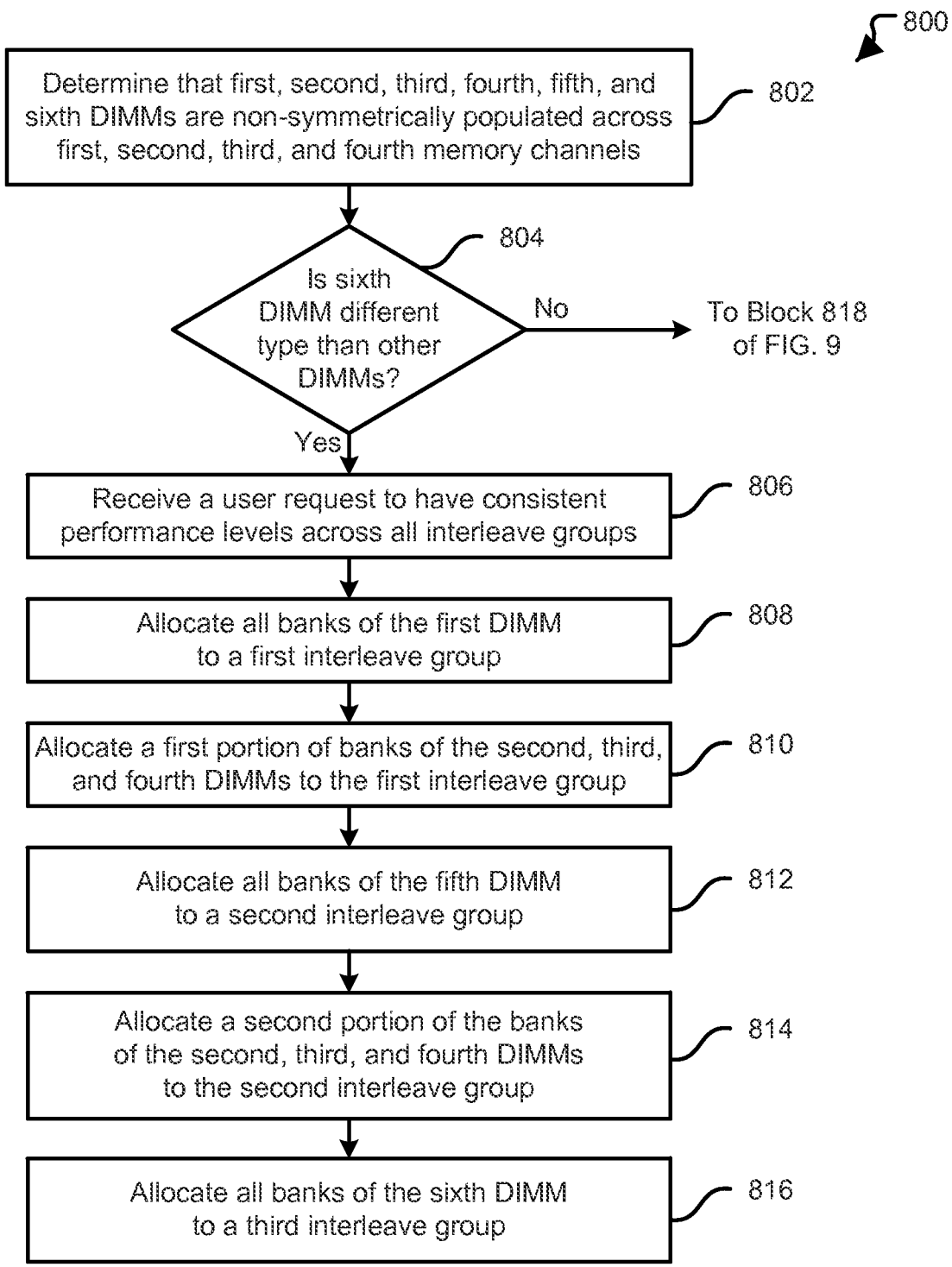
FIGS. 8 and 9 are a flow diagram of a method for implementing memory interleaving within the information handling system according to an embodiment of the present disclosure.
Figure 9:
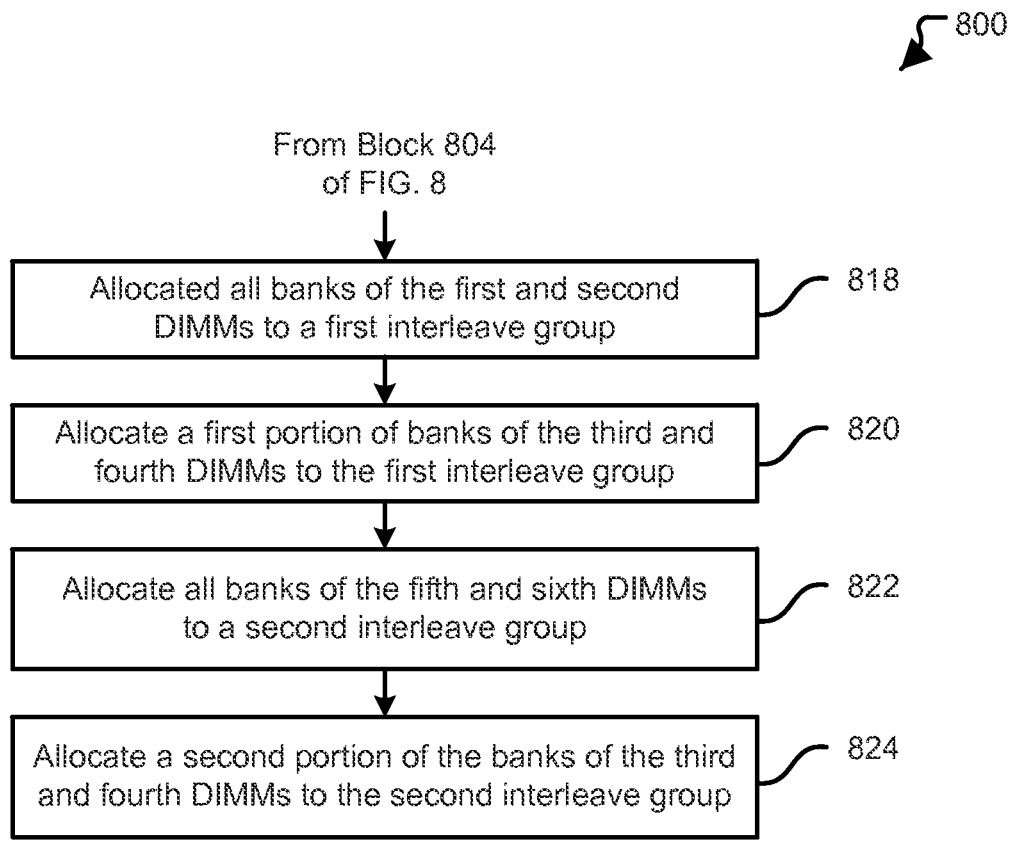

FIGS. 8 and 9 show a flow diagram of a method 800 for implementing memory interleaving within the information handling system according to an embodiment of the present disclosure. At block 802, first, second, third, fourth, fifth, and sixth DIMMs are determined to be non-symmetrically populated across first, second, third, and fourth memory channels. In an embodiment, the memory channels can be DDR memory channels. At block 804, a determination is made whether one of the DIMMs is a different type of DIMM than the other DIMMs. In an embodiment, the different types of DIMM can be a NVM DIMM or a DRAM DIMM. If one of the DIMMs is a different type of DIMM, then the flow continues at block 806, otherwise the flow continues at block 818. At block 806, a user request to have consistent performance levels across all interleave groups is received.

All banks of the first DIMM are allocated to a first interleave group at block 808. In an embodiment, each of the DIMMs can include 16 banks (banks 0-15). At block 810, a first portion of banks of the second, third, and fourth DIMMs are allocated to the first interleave group. In an embodiment, the first portion of banks can include banks 0-7 of the second, third, and fourth DIMMs. All banks of the fifth DIMM are allocated to a second interleave group at block 812. At block 814, a second portion of the banks of the second, third, and fourth DIMMs are allocated to the second interleave group. In an embodiment, the second portion of the second, third, and fourth DIMMs can be banks 8-15 of the second, third, and fourth DIMMs.

Returning to block 804, when all of the DIMMs are all of the same type of DIMM, all banks of the first and second DIMMs are allocated to a first interleave group at block 818. At block 820, a first portion of banks of the third and fourth DIMMs are allocated to the first interleave group. All banks of the fifth and sixth DIMMs are allocated to a second interleave group at block 822. At block 824, a second portion of the banks of the third and fourth DIMMs are allocated to the second interleave group.

Figure 10:
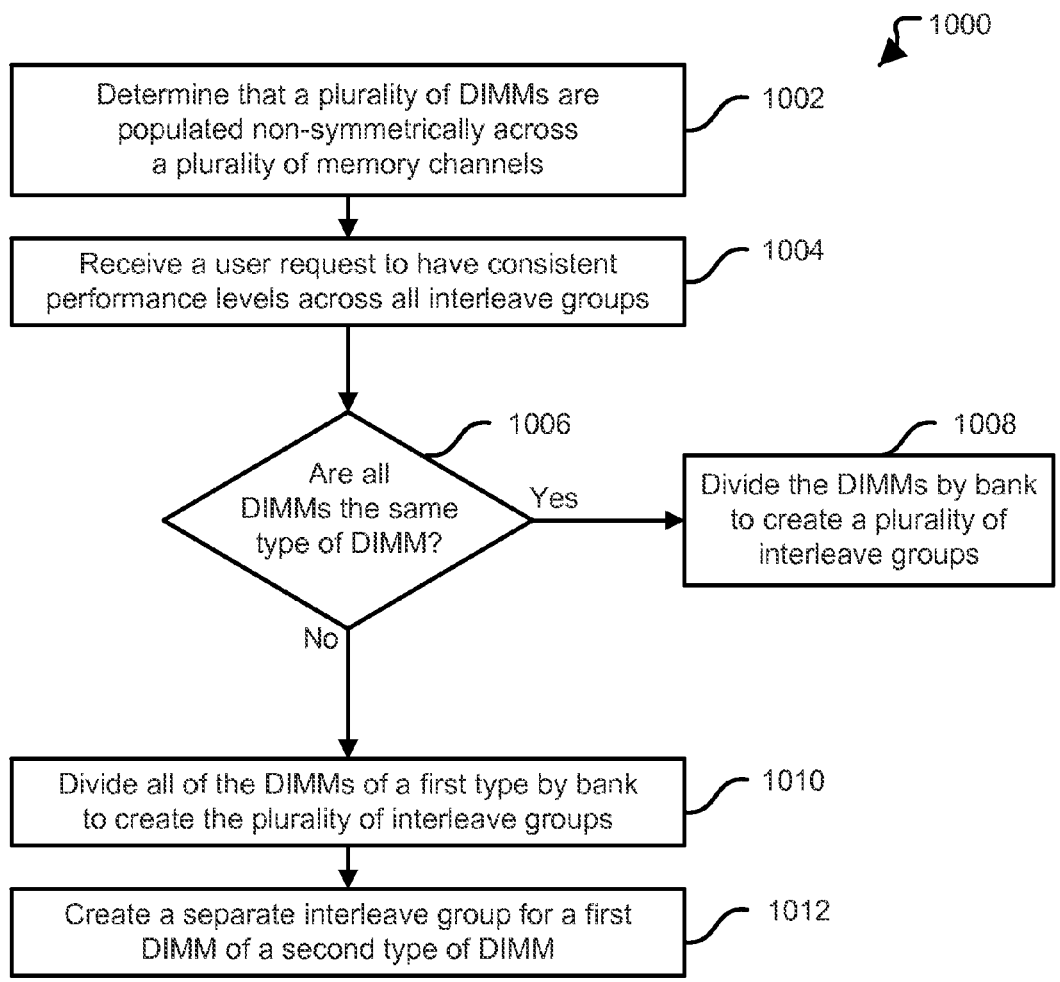
FIG. 10 is a flow diagram of another method for implementing memory interleaving within the information handling system according to an embodiment of the present disclosure.

FIG. 10 is a flow diagram of another method 1000 for implementing memory interleaving within the information handling system according to an embodiment of the present disclosure. At block 1002, a determination is made that a plurality of DIMMs are populated non-symmetrically across a plurality of memory channels. In an embodiment, the memory channels can be DDR channels. A user request to have consistent performance levels across all interleave groups is received at block 1004. At block 1006, a determination is made whether all of the DIMMs are the same type of DIMM. In an embodiment, the different types of DIMM can be a NVM DIMM or a DRAM DIMM. If all of the DIMMs are the same type of DIMM, the DIMMs are divided by bank to create a plurality of interleave groups at block 1008. However, if all of the DIMMs are not the type of DIMM, all of the DIMMs of a first type are divided by bank to create a plurality of interleave groups at block 1010. At block 1012, a separate interleave group is created for a first DIMM of a second type of DIMM.

Figure 11:
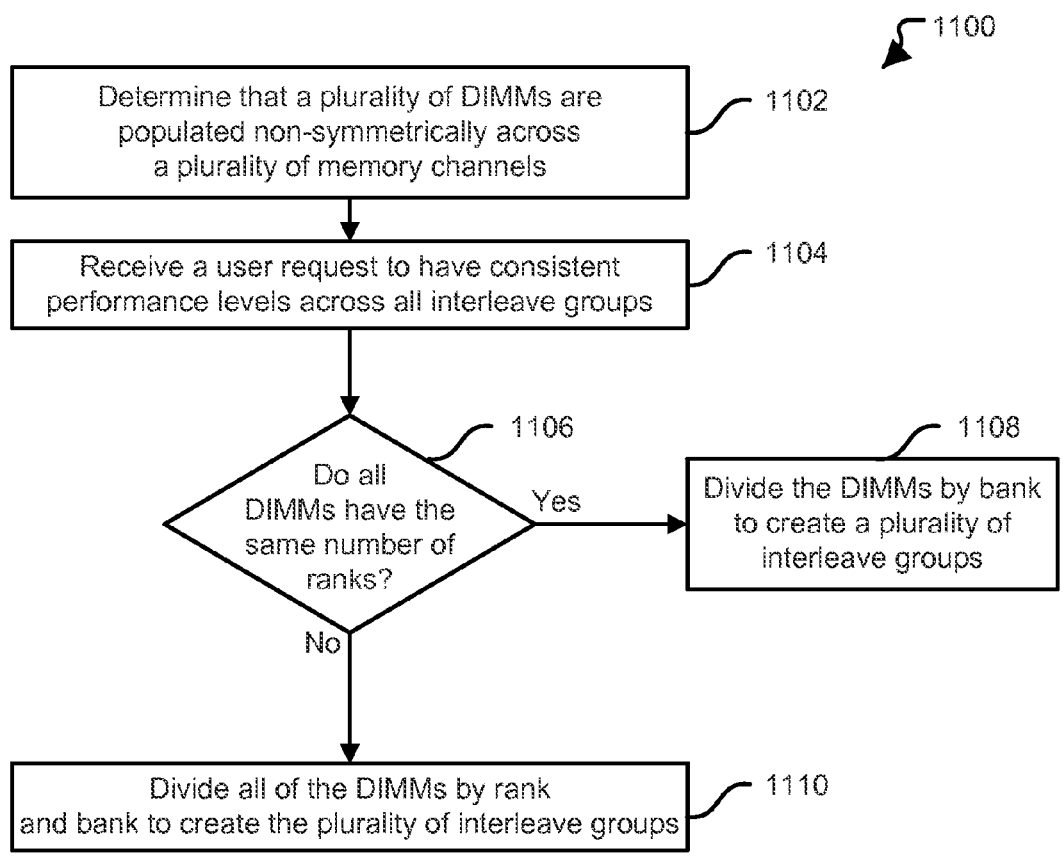
FIG. 11 is a flow diagram of another method for implementing memory interleaving within the information handling system according to an embodiment of the present disclosure.

FIG. 11 is a flow diagram of another method 1100 for implementing memory interleaving within the information handling system according to an embodiment of the present disclosure. At block 1102, a determination is made that a plurality of DIMMs are populated non-symmetrically across a plurality of memory channels. In an embodiment, the memory channels can be DDR channels. A user request to have consistent performance levels across all interleave groups is received at block 1104. At block 1106, a determination is made whether all of the DIMMs have the same number of ranks. If all of the DIMMs number of ranks, the DIMMs are divided by bank to create a plurality of interleave groups at block 1108. However, if all of the DIMMs do not have the same number of ranks, the DIMMs are divided by rank and bank to create a plurality of interleave groups at block 1110. In an embodiment, dividing the DIMMs by rank and bank includes having banks from a rank of a DIMM in each of the interleave groups.

Figure 12:
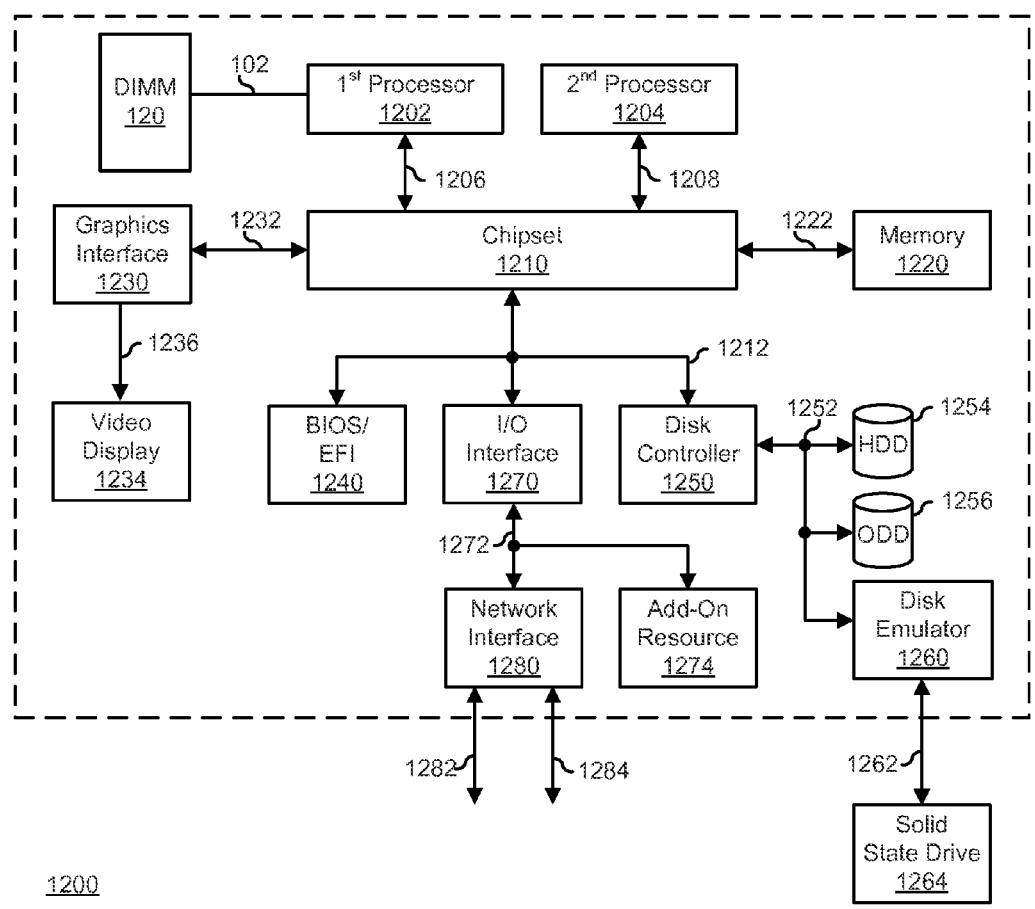
FIG. 12 is a block diagram illustrating a general information handling system according to an embodiment of the present disclosure.

FIG. 12 illustrates a generalized embodiment of general information handling system 1200, such as information handling system 100. For purpose of this disclosure information handling system 1200 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 1200 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 1200 can include processing resources for executing machine-executable code, such as a central processing unit (CPU), a programmable logic array (PLA), an embedded device such as a System-on-a-Chip (SoC), or other control logic hardware. Information handling system 1200 can also include one or more computer-readable medium for storing machine-executable code, such as software or data. Additional components of information handling system 1200 can include one or more storage devices that can store machine-executable code, one or more communications ports for communicating with external devices, and various input and output (I/O) devices, such as a keyboard, a mouse, and a video display. Information handling system 1200 can also include one or more buses operable to transmit information between the various hardware components.

Information handling system 1200 can include devices or modules that embody one or more of the devices or modules described above, and operates to perform one or more of the methods described above. Information handling system 1200 includes a processors 1202 and 1204, a chipset 1210, a memory 1220, a graphics interface 1230, include a basic input and output system/extensible firmware interface (BIOS/EFI) module 1240, a disk controller 1250, a disk emulator 1260, an input/output (I/O) interface 1270, and a network interface 1280. Processor 1202 is connected to chipset 1210 via processor interface 1206, and processor 1204 is connected to the chipset via processor interface 1208. Processor 1202 is also connected to DIMM 120 via the DDR channel 102 as described above. Memory 1220 is connected to chipset 1210 via a memory bus 1222. Graphics interface 1230 is connected to chipset 1210 via a graphics interface 1232, and provides a video display output 1236 to a video display 1234. In a particular embodiment, information handling system 1200 includes separate memories that are dedicated to each of processors 1202 and 1204 via separate memory interfaces. An example of memory 1220 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 1240, disk controller 1250, and I/O interface 1270 are connected to chipset 1210 via an I/O channel 1212. An example of I/O channel 1212 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 1210 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. BIOS/EFI module 1240 includes BIOS/EFI code operable to detect resources within information handling system 1200, to provide drivers for the resources, initialize the resources, and access the resources. BIOS/EFI module 1240 includes code that operates to detect resources within information handling system 1200, to provide drivers for the resources, to initialize the resources, and to access the resources.

Disk controller 1250 includes a disk interface 1252 that connects the disc controller to a hard disk drive (HDD) 1254, to an optical disk drive (ODD) 1256, and to disk emulator 1260. An example of disk interface 1252 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 1260 permits a solid-state drive 1264 to be connected to information handling system 1200 via an external interface 1262. An example of external interface 1262 includes a USB interface, an IEEE 1394 (Firewire) interface, a proprietary interface, or a combination thereof. Alternatively, solid-state drive 1264 can be disposed within information handling system 1200.

I/O interface 1270 includes a peripheral interface 1272 that connects the I/O interface to an add-on resource 1274 and to network interface 1280. Peripheral interface 1272 can be the same type of interface as I/O channel 1212, or can be a different type of interface. As such, I/O interface 1270 extends the capacity of I/O channel 1212 when peripheral interface 1272 and the I/O channel are of the same type, and the I/O interface translates information from a format suitable to the I/O channel to a format suitable to the peripheral channel 1272 when they are of a different type. Add-on resource 1274 can include a data storage system, an additional graphics interface, a network interface card (NIC), a sound/video processing card, another add-on resource, or a combination thereof. Add-on resource 1274 can be on a main circuit board, on separate circuit board or add-in card disposed within information handling system 1200, a device that is external to the information handling system, or a combination thereof.

Network interface 1280 represents a NIC disposed within information handling system 1200, on a main circuit board of the information handling system, integrated onto another component such as chipset 1210, in another suitable location, or a combination thereof. Network interface device 1280 includes network channels 1282 and 1284 that provide interfaces to devices that are external to information handling system 1200. In a particular embodiment, network channels 1282 and 1284 are of a different type than peripheral channel 1272 and network interface 1280 translates information from a format suitable to the peripheral channel to a format suitable to external devices. An example of network channels 1282 and 1284 includes InfiniBand channels, Fibre Channel channels, Gigabit Ethernet channels, proprietary channel architectures, or a combination thereof. Network channels 1282 and 1284 can be connected to external network resources (not illustrated). The network resource can include another information handling system, a data storage system, another network, a grid management system, another suitable resource, or a combination thereof.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   determining, by a processor, that a plurality of dual inline memory modules are populated non-symmetrically across a plurality of memory channels;
   dividing, by the processor, the dual inline memory modules by bank to create a plurality of interleave groups, wherein each of the interleave groups spans across all of the memory channels, and consecutive accesses to a single interleave group are to banks of different dual inline memory modules on different memory channels;
   dividing all of the dual inline memory modules of a first type by bank to create a plurality of interleave groups, wherein each of the interleave groups that include the dual inline memory modules of the first type spans across all of the memory channels; and
   creating a separate interleave group for a first dual inline memory module of the dual inline memory modules in response to the first dual inline memory module being a second type of dual inline memory module.

2. The method of claim 1, wherein each of the interleave groups has the same performance level as the other interleave groups.

3. The method of claim 1, wherein the dual inline memory modules are populated non-symmetrically across the memory modules in response to a first memory channel having more dual inline memory modules populated than the other memory channels have populated.

4. The method of claim 1, wherein the dual inline memory modules are populated non-symmetrically across the memory modules in response to a first memory channel having a different type of dual inline memory module than the other memory channels have populated.

5. The method of claim 1, further comprising:
   receiving a user request to have consistent performance across all interleave groups prior to allocating first and second interleave groups of the interleave groups.

6. An information handling system comprising:
   a processor including a plurality of memory channels; and
   a plurality of dual inline memory modules non-symmetrically populated on the memory channels, wherein the dual inline memory modules are divided by bank to create a plurality of interleave groups, wherein each of the interleave groups spans across all of the memory channels of the processor, and consecutive accesses to a single interleave group are to banks of different dual inline memory modules on different memory channels, wherein all of the dual inline memory modules of a first type are divided by bank to create a plurality of interleave groups, wherein each of the interleave groups that include the dual inline memory modules of the first type spans across all of the memory channels, and a separate interleave group for a first dual inline memory module of the dual inline memory modules is created in response to the first dual inline memory module being a second type of dual inline memory module.

7. The information handling system of claim 6, wherein each of the interleave groups has the same performance level as the other interleave groups.

8. The information handling system of claim 6, wherein the dual inline memory modules are populated non-symmetrically across the memory modules in response to a first memory channel having more dual inline memory modules populated than the other memory channels have populated.

9. The information handling system of claim 6, wherein the dual inline memory modules are populated non-symmetrically across the memory modules in response to a first memory channel having a different type of dual inline memory module than the other memory channels have populated.

10. The information handling system of claim 6, wherein the first type of dual inline memory module is a volatile dynamic random access memory based dual inline memory module and the second type of dual inline memory module is a non-volatile memory based dual inline memory module.

11. The information handling system of claim 6, wherein the allocation of first and second interleave groups of the interleave groups is in response to a user request to have consistent performance across all interleave groups being received.

12. A method comprising:
- determining, by a processor, that a plurality of dual inline memory modules are populated non-symmetrically across a plurality of memory channels;
- dividing, by the processor, the dual inline memory modules by rank and bank to create a plurality of interleave groups, wherein each of the interleave groups spans across all of the memory channels, wherein banks of a first rank of one of the dual inline memory modules are included in each of the interleave groups, and consecutive accesses to a single interleave group are to banks of different dual inline memory modules on different memory channels;
- dividing all of the dual inline memory modules of a first type by rank to create a plurality of interleave groups, wherein each of the interleave groups that include the dual inline memory modules of the first type spans across all of the memory channels; and
- creating a separate interleave group for a first dual inline memory module of the dual inline memory modules in response to the first dual inline memory module being a second type of dual inline memory module.

13. The method of claim 12, wherein each of the interleave groups has the same performance level as the other interleave groups.

14. The method of claim 12, wherein the dual inline memory modules are populated non-symmetrically across the memory modules in response to a first memory channel having more dual inline memory modules populated than the other memory channels have populated.

15. The method of claim 12, wherein the dual inline memory modules are populated non-symmetrically across the memory modules in response to a first memory channel having a different type of dual inline memory module than the other memory channels have populated.

16. The method of claim 12, further comprising:
- receiving a user request to have consistent performance across all interleave groups prior to allocating first and second interleave groups of the interleave groups.

17. The method of claim 12, wherein a first dual inline memory module and the dual inline memory modules includes two ranks, and a second dual inline memory module of the dual inline memory modules includes only one rank.

* * * * *